United States Patent [19]

Goto

[11] Patent Number: 5,335,702
[45] Date of Patent: Aug. 9, 1994

[54] CUTTING AND FORMING DEVICE FOR LEAD FRAME FOR THE SEMICONDUCTOR DEVICE

[75] Inventor: Akihiko Goto, Yamagata, Japan
[73] Assignee: NEC Corporation, Japan
[21] Appl. No.: 900,898
[22] Filed: Jun. 18, 1992
[30] Foreign Application Priority Data
Jun. 21, 1991 [JP] Japan .............. 3-046705[U]
[51] Int. Cl.⁵ .................................... B21F 1/00
[52] U.S. Cl. .................... 140/105; 29/741; 72/452
[58] Field of Search .......... 72/452, 420, 418, 448, 72/421, 446, 465; 29/566.2, 566.3, 741, 827; 140/105

[56] References Cited

U.S. PATENT DOCUMENTS

| | | | |
|---|---|---|---|
| 3,872,898 | 3/1975 | Parks | 140/105 |
| 4,817,266 | 4/1989 | Holcomb | 140/105 |
| 4,819,699 | 4/1989 | Brown et al. | 29/741 |
| 4,862,929 | 9/1989 | Perry | 140/105 |
| 4,918,956 | 4/1990 | Schoch | 72/452 |
| 4,958,722 | 9/1990 | Kobayashi et al. | 29/741 |
| 4,972,572 | 11/1990 | Kimura et al. | 140/105 |
| 5,012,664 | 5/1991 | Hembree | 140/105 |
| 5,048,412 | 9/1991 | Murakami | 72/452 |
| 5,070,916 | 12/1991 | Biesecker | 140/105 |
| 5,105,857 | 4/1992 | Ellis | 140/105 |

FOREIGN PATENT DOCUMENTS

0127136 6/1987 Japan .................. 140/105

Primary Examiner—David Jones
Attorney, Agent, or Firm—Laff, Whitesel, Conte & Saret

[57] ABSTRACT

A cutting and forming device of a lead frame of a resin molded semi-finished semiconductor device makes use of a press mechanism having a speed deceleration function in the vicinity of a bottom dead point of a press ram. The device includes an upper die base and a lower die base, a stripper frame, a die, a feeder for lead frames, and a machine base. The feeder is mounted over the lower die base and fixed to the machine base. In order to reduce impact noise when the stripper frame and the feeder abut with each other, there is provided an air cylinder mounted on the machine base and a cam follower plate fixed to an underside of the lower die base as well as a cam plate slidably mounted on the machine base for horizontal movement by the air cylinder which is driven by a driving mechanism independent from that for the press ram. In an alternative arrangement, the air cylinder may be fixed to the lower die base and carry the feeder in such a way as to allow the feeder to move up and down through the air cylinder. All the noise making impacts concentrate in the vicinity of the bottom dead point of the press ram and this enables to reduce noise during the press operation.

3 Claims, 4 Drawing Sheets

CUTTING AND FORMING DEVICE FOR LEAD FRAME FOR THE SEMICONDUCTOR DEVICE

BACKGROUND OF THE INVENTION (1) Field of the Invention

The present invention relates to a device for cutting and forming a lead frame of a semiconductor device, which is used in a manufacturing process of the semiconductor device.

(2) Description of the Related Art

A conventional cutting and forming device of the kind to which the present invention relates is explained with reference to the appended drawings. FIG. 1 is a diagrammatic view of such conventional cutting and forming device. FIG. 2A is a diagrammatic view showing the relation in locations of a die 5 of the device and a semi-finished product 10 molded in resin, in a state where the latter is being forwardly fed, and FIG. 2B is a diagrammatic view showing the relation in locations of the die 5 and the semi-finished product 10 in a state in which the die 5 is at its bottom dead point.

As shown in FIG. 2B, as the die 5 is provided with a relief or recess portion having a sufficient depth so as to give a slight relief for a bottom surface of the semi-finished product 10, the lead frames 3 are allowed to be in contact with the upper surface of the die 5 while a cutting and forming process is actually performed. As shown in FIG. 2A, when the lead frames 3 are to be fed forwardly, they are lifted up by a lifting mechanism to an extent larger than the thickness of a resin portion of the semi-finished product 10 (approximately 5 mm as shown by "A" in the drawings). Such lifting mechanism lifts up an entire feeding rails 4 as shown in FIG. 1. The feeding rail 4 is carried by guide posts provided on a lower die base 6 and is pressed up by spring means.

Such conventional cutting and forming device includes, as a press mechanism, an upper die base 1, a punch 11 and a stripper frame 2. The downward operation of the press mechanism accompanies noise which is produced mainly at a point when the stripper frame 2 strikes or abuts against the feeding rail 4 and at a point when the stoppers provided in the upper and lower die bases strike against each other at the bottom dead point of the press ram. In order to reduce noise of such kinds, it is necessary that the speed of the press operation at the above two points be decelerated. For doing so, a means employed is to have the press mechanism driven by a servo-motor and have the speed of the motor controlled so as to decelerate the speed of the downward movement of the press mechanism. FIG. 3 shows, with a press mechanism having a speed deceleration function in the vicinity of the bottom dead point of the press ram as an example, the relation between ram changes and press ram speeds obtained by a crank driven mechanism. It is seen therein that the ram speeds are controlled so that they are decelerated along a curve and reach the bottom dead point.

In the conventional cutting and forming device as explained above, as shown in FIG. 1, the stripper frame 2 of the upper die base 1 in its downward movement presses down the feeding rails 4 so that the position at which stripper frame 2 abuts on the feeding rails 4 is about 7 mm above the bottom dead point, the value being the sum of 5 mm which is the relief (shown by "A" in FIG. 2A) for the thickness of the resin molding portion of the semi-finished product 10 and 2 mm which is the amount of the movement of the punch 11 thrusting into the die 5 in the lead cutting operation.

Also, in the upward movement of the press ram which takes place when the feeding rail and the stripper frame restore to their initial states they are stopped suddenly by their stoppers thereby producing noise. This develops at the position about 5–7 mm above the bottom dead point. Thus, in the upward movement of the press ram also, it is necessary that the speed of the press ram movement be decelerated. This state is shown by a timing chart in FIG. 7A from which it is noted that, at the point at which the feeding rails 4 and the stripper frame 2 abut with their stoppers, the upward and downward speeds of the press ram are decelerated.

In the conventional device, it was necessary that, in order to reduce noise of various kinds, the speeds of the press ram should be decelerated at a plurality of points as explained above, which presented the problem that a time necessary for one-shot operation unavoidably became long. This problem in the conventional device is to be solved by the invention.

SUMMARY OF THE INVENTION

It is, therefore, an object of the invention to overcome the problems existing in the conventional arrangement and to provide an improved cutting and forming device by which noise is effectively reduced.

A further object of the invention is to provide a cutting and forming device in which all the noise making impacts are caused to concentrate in the vicinity of a bottom dead point of the press ram, thereby enabling to reduce noise during the press operation.

According one aspect of the invention, there is provided a cutting and forming device by which a lead frame of a resin molded semi-finished semiconductor device is cut and which makes use of a press mechanism having a speed deceleration function in the vicinity of a bottom dead point of a press ram, the device comprising:

a machine base;

an upper die base and a lower die base;

a stripper frame carried by the upper die base;

a pair of feeding rails mounted over the lower die base and fixed to the machine base; and an impact relief means mounted in the lower die base for reducing impact noise when the stripper frame and the feeding rails abut with each other, the impact relief means having an air cylinder means mounted on the machine base, a cam follower plate fixed to an underside of the lower die base and a cam plate slidably mounted on the machine base for horizontal movement by the air cylinder means.

In an alternative arrangement, the air cylinder may be fixed to the lower die base and carry the feeding rails in such a way as to allow the feeding rails to move up and down by the air cylinder means.

All the noise making impacts are caused to concentrate in the vicinity of the bottom dead point of the press ram, thereby enabling to reduce noise during the press operation.

BRIEF DESCRIPTION OF THE DRAWINGS

The above and other objects, features and advantages of the present invention will be apparent from the following description of preferred embodiments of the invention explained with reference to the accompanying drawings, in which.

PREFERRED EMBODIMENTS OF THE INVENTION

Figure 1:
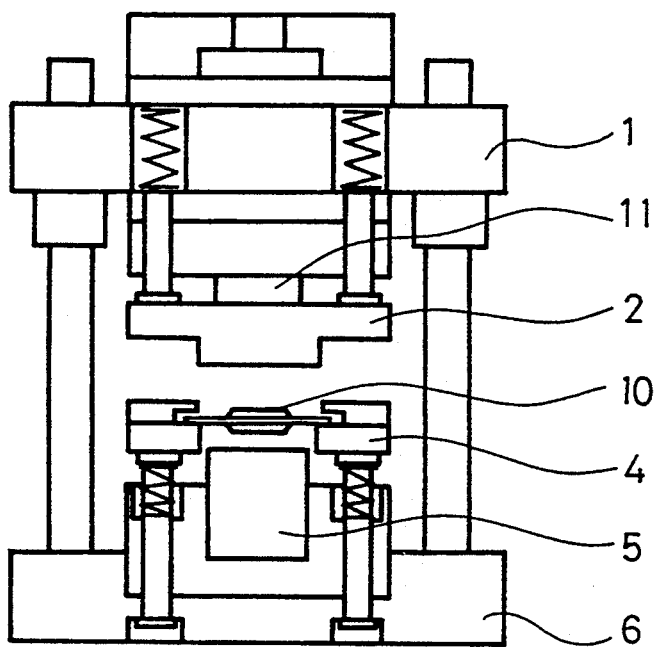
FIG. 1 is a diagrammatic view of a conventional cutting and forming device.
Figure 2A:
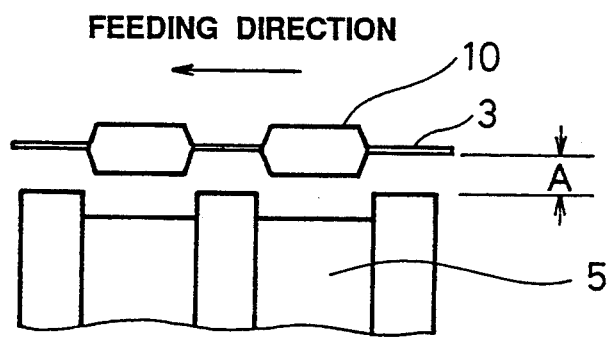
FIG. 2A is a diagram showing the position of the lead frames with respect to other related elements in the conventional device.
Figure 2B:
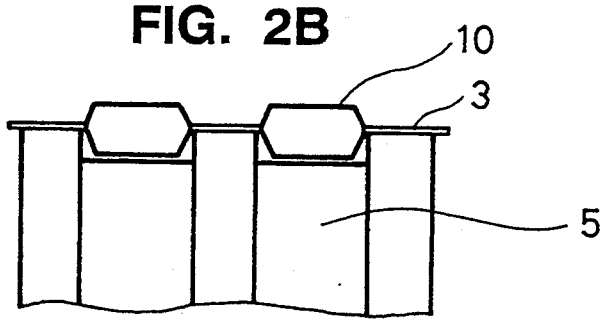
FIG. 2B is a diagram showing the position of the lead frames when the press ram is at its bottom dead point in the conventional device.

The present invention will now be explained with reference to the accompanying drawings. The reference numerals used in FIG. 1 for the conventional device are also used for the same or like elements of the embodiments of the invention shown in FIGS. 4 through 6.

Figure 4:
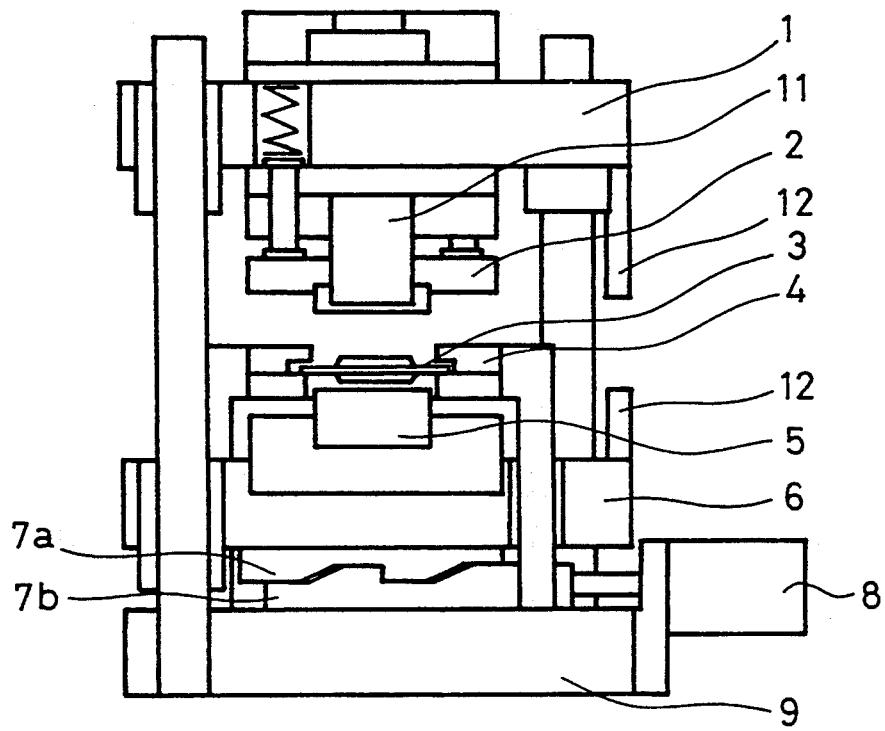
FIG. 4 is a diagrammatic view of a cutting and forming device of a first embodiment according to the invention.
Figure 5:
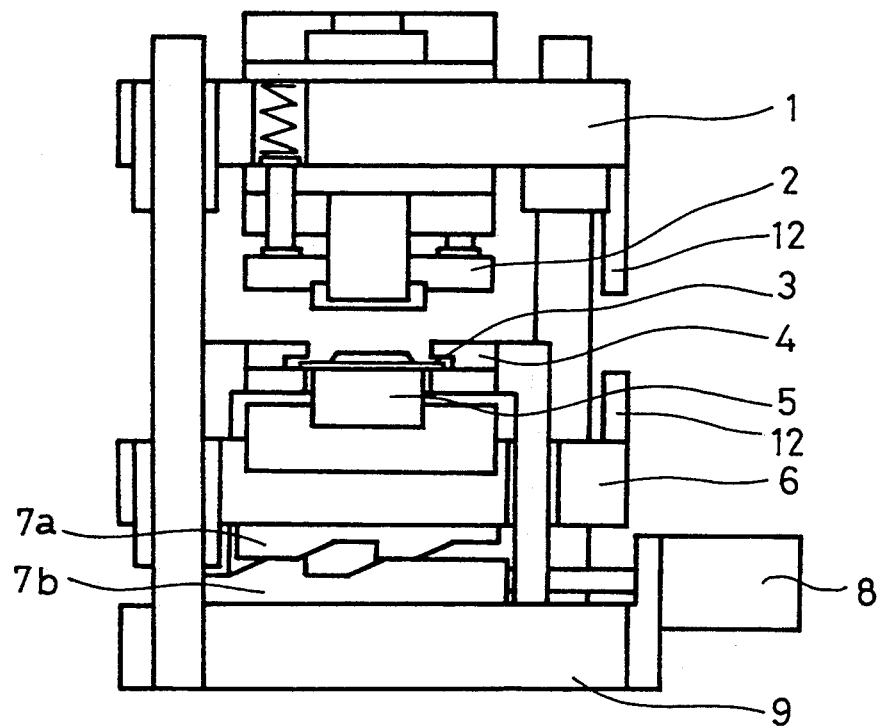
FIG. 5 is a diagrammatic view showing a state in which the lower die base is raised in the device shown in FIG. 4.

FIG. 4 is a diagrammatic view of the cutting and forming device of the first embodiment according to the invention. FIG. 5 shows in a diagrammatic view of the device in the state in which a lower die base 6 of the device shown in FIG. 4 is in its raised position.

As shown in FIG. 4, a pair of feeding rails 4 are fixed to a machine base 9 through appropriate connecting members, and a plate cam follower 7a is fixed to an underside of the lower die base 6. The plate cam follower 7a engages with a plate cam 7b which slides horizontally on the machine base 9 by means of an air cylinder 8 which is a driving means independent from that for the press mechanism involved. The plate cam followers 7a, the plate cam 7b and the air cylinder 8 which raise the die 5 up and down serve as an impact relief means in this embodiment. The feeding of the lead frame 3 takes place when the lower die base 6 is in its lowered position as shown in FIG. 4. It should be noted that, when the feeding operation is completed, the lower die base 6 is lifted up due to the movement of the plate cam 7b by the air cylinder 8 as shown in FIG. 5 thereby causing the die 5 to be in complete contact with the lead frame 3. Under this state, the press ram moves down and the bottom dead point thereof is at the point at which, after the stripper frame 2 is brought in contact with the feeding rail 4, the punch 11 has moved down into the die 5 for about 1–2 mm.

Figure 3:
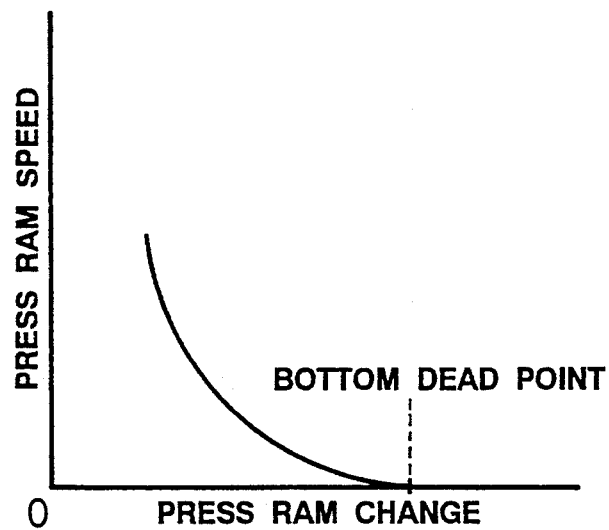
FIG. 3 is a graph showing the relation between the speeds of the press ram and the changes in the press ram.

According to the embodiment as explained above, there is no need to cause the feeding rails 4 to move downwardly, so that the point at which the stripper frame 2 is brought in contact with the feeding rails is closer to the bottom dead point by about 3 mm than that in the conventional one, For this reason, the position at which the stripper frame 2 and the feeding rails 4 abut with each other and the position at which the stoppers of the upper die base 1 and the lower die base 6 abut with each other may be in a range of 1–2 mm from the bottom dead point. This means that, when use is made of the press mechanism in which the ram decelerates at the bottom dead point as shown in FIG. 3, the action of abutment or striking takes place at a low speed, whereby the level of noise is significantly reduced.

Figure 6:
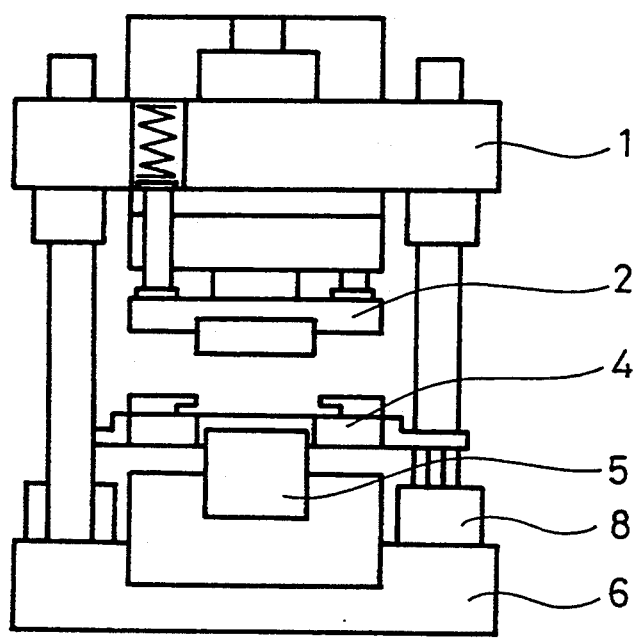
FIG. 6 is a diagrammatic view of a cutting and forming device of a second embodiment according to the invention.

FIG. 6 shows a diagrammatic view of a cutting and forming device of a second embodiment according to the present invention. Here, the feeding rail 4 is provided with an impact relief means which includes an air cylinder 8 fixed to the lower die base 8 and by which the feeding rail 4 is raised. During the feeding movement of lead frame, the feeding rails 4 are in their raised positions and, during the downward movement of the press ram, the feeding rails 4 also assume their downward movement so that the lead frame is brought in contact with the die 5. Thereafter, the device operates in the same way as explained with reference to the first embodiment.

Figure 7A:
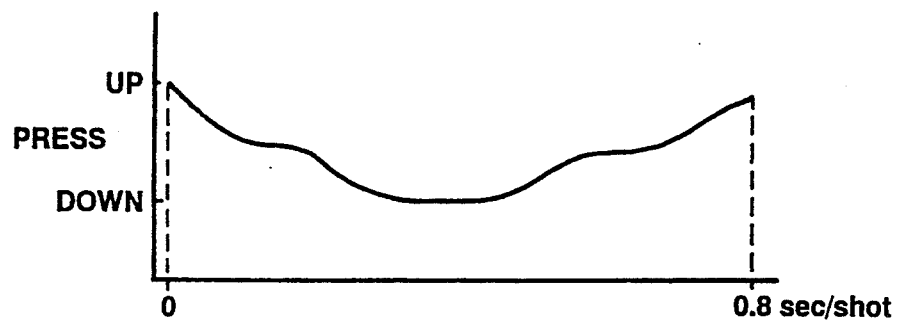
FIGS. 7A–7C are timing charts respectively showing comparisons of press operations between the conventional device and the devices according to the present invention, in which FIG. 7A relates to the conventional device, FIG. 7B and 7C respectively relate to the first and second embodiments of the invention.
Figure 7B:
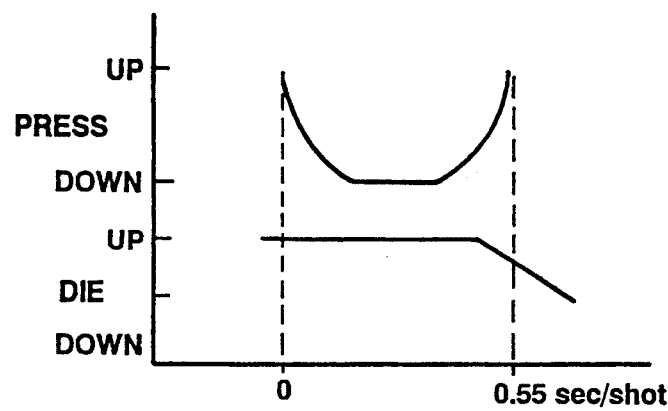
Figure 7C:
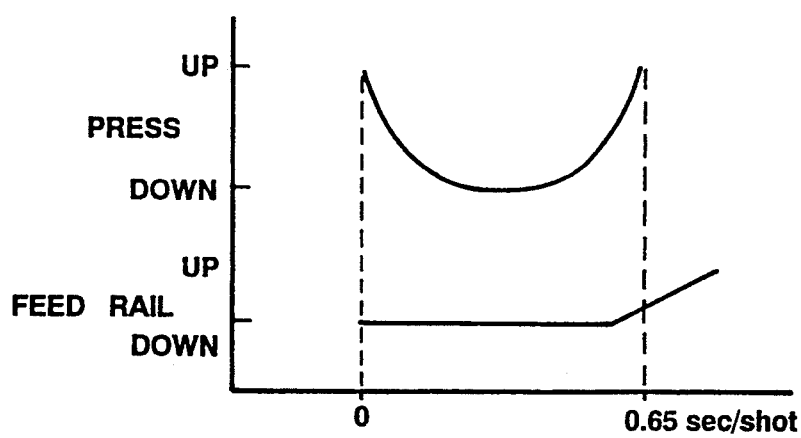

FIGS. 7A through 7C compare by timing charts the operations of the devices of the first and second embodiments with the conventional device. In the charts, the up and down movement distance of the press ram and/or the die is shown in the axis of ordinates and the time of each shot is shown in the axis of abscissas. Specifically, FIG. 7A is a timing chart for the press operation performed in the state when the speed is decelerated at the noise making points, FIG. 7B is a timing chart for the same with respect to the first embodiment according to the invention, and FIG. 7C is a timing chart for the same with respect to the second embodiment according to the invention.

Whereas the operating time is 0.8 sec/shot in the conventional device as shown in FIG. 7A, the same in the first embodiment of the invention is 0.55 sec/shot as shown in FIG. 7B and also the same in the second embodiment of the invention is 0.65 sec/shot as shown in FIG. 7C. FIGS. 7B and 7C indicate that, since the ram speed is not required to be decelerated for the stripper frame to abut against the feeding rails, the noise level can be reduced without the need of extending the time for the press operation. The noise level can be reduced to about 75 phons which in the case of the conventional one is about 80 phons.

According to the present invention, the press ram is so arranged as to be decelerated at the immediate vicinity of the bottom dead point of the ram movement and, also, the impact deceleration means is arranged to be driven by a power separate from that for moving the press ram. All the noise making causes concentrate at the bottom dead point where the press ram operates at a lowered speed for a limited short time and this enables to reduce noise to a level of about 75 phons which does not present problems to general working environment.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A cutting and forming device by which a lead frame of a resin molded semi-finished semiconductor device is cut by a press mechanism having a press ram, means for driving said press ram with deceleration near a dead bottom point of said press ram, said press ram being a single press ram, said device comprising:

a machine base, a lower die base, and an upper die base;

an upper die carried by said upper die base;

a stripper frame carried by said upper die base;

a pair of feeding rails fixed to said machine base; and a noise reducing means associated with said lower die base and operated by a driving means independent from said means for driving said single press ram, said noise reducing means enabling said lower die to be in a predetermined lowered position during the feeding of a lead frame and to be in a predetermined raised position upon completion of the feeding of said lead frame for said lower die to be in complete contact with said lead frame.

2. A cutting and forming device by which a lead frame of a resin molded semi-finished semiconductor device is cut by a press mechanism having a press ram, means for driving said press ram with deceleration near a dead bottom point of said press ram, said press ram being a single press ram, said device comprising:

a machine base, a lower die base, and an upper die base;

a lower die carried by said lower die base;

a stripper frame carried by said upper die base;

a pair of feeding rails fixed to said machine base; and a noise reducing means associated with said lower die base and operated by a driving means independent from said means for driving said single press ram, said noise reducing means comprises an air cylinder means mounted on said machine base, a cam follower plate fixed to an underside of said lower die base and a cam plate slidably mounted on said machine base for horizontal movement in response to an operation of said air cylinder means, said noise reducing means enabling said lower die to be in a predetermined lowered position during the feeding of a lead frame and to be in a predetermined raised position upon completion of the feeding of said lead frame for said lower die to be in complete contact with said lead frame.

3. A cutting and forming device according to claim 2, in which said stripper frame and said feeding rails are arranged such that, after said stripper frame is brought in contact with said feeding rails, said upper die is enabled to be pressed down for about 1–2 mm before reaching said bottom dead point of said press ram.

* * * * *